US007010612B1

(12) United States Patent
Si et al.

(10) Patent No.: US 7,010,612 B1
(45) Date of Patent: Mar. 7, 2006

(54) UNIVERSAL SERIALIZER/DESERIALIZER (75) Inventors: Kwok Hung Si, Sunnyvale, CA (US); Tibet Mimaroglu, Sunnyvale, CA (US)

(73) Assignee: Ubicom, Inc., Mountain View, CA (US)

( * ) Notice: Subject to any disclaimer, the term of this patent is extended or adjusted under 35 U.S.C. 154(b) by 689 days.

(21) Appl. No.: 09/888,212

(22) Filed: Jun. 22, 2001

Related U.S. Application Data (60) Provisional application No. 60/213,745, filed on Jun. 22, 2000, provisional application No. 60/250,781, filed on Dec. 1, 2000, provisional application No. 60/251,468, filed on Dec. 4, 2000.

(51) Int. Cl.
  G06F 15/16 (2006.01)
  G06F 15/173 (2006.01)
  H04J 3/06 (2006.01)

(52) U.S. Cl. ............. 709/232; 709/248; 370/395.62; 370/503; 712/40

(58) Field of Classification Search ............ 709/230, 709/200, 246, 236; 711/100; 341/100; 714/798; 712/40

See application file for complete search history.

(56) References Cited

U.S. PATENT DOCUMENTS

| | | | |
|---|---|---|---|
| 4,110,831 A | 8/1978 | Langdon, Jr. | |
| 4,777,587 A | 10/1988 | Case et al. | |
| 4,821,187 A | 4/1989 | Ueda et al. | |
| 4,825,355 A | 4/1989 | Kurakazu et al. | |
| 4,939,735 A * | 7/1990 | Fredericks et al. | 714/798 |
| 5,163,146 A | 11/1992 | Antanaitis, Jr. et al. | |
| 5,247,636 A | 9/1993 | Minnick et al. | |
| 5,247,638 A | 9/1993 | Minnick et al. | |
| 5,260,703 A * | 11/1993 | Nguyen et al. | 341/100 |
| 5,392,435 A | 2/1995 | Masui et al. | |
| 5,410,658 A | 4/1995 | Sawase et al. | |
| 5,430,884 A | 7/1995 | Beard et al. | |
| 5,515,538 A | 5/1996 | Kleiman | |
| 5,524,250 A | 6/1996 | Chesson et al. | |
| 5,727,211 A | 3/1998 | Gulsen | |
| 5,761,470 A | 6/1998 | Yoshida | |
| 5,867,725 A | 2/1999 | Fung et al. | |
| 5,907,694 A | 5/1999 | Suzuki et al. | |
| 5,933,650 A | 8/1999 | van Hook et al. | |
| 5,944,816 A | 8/1999 | Dutton et al. | |
| 6,009,505 A | 12/1999 | Thayer et al. | |
| 6,026,503 A | 2/2000 | Gutgold et al. | |

(Continued)

FOREIGN PATENT DOCUMENTS

WO   WO 99/54813   10/1999

OTHER PUBLICATIONS

Schwan, Karsten and Zhou, Hongyi; Dynamic Scheduling Of Hard Real-Time Tasks And Real-Time Threads; IEEE Transactions On Software Engineering; vol. 18, No. 8; Aug. 1992; pp. 736-748.

(Continued)

*Primary Examiner*—Paul H. Kang
(74) *Attorney, Agent, or Firm*—Fenwick & West LLP

(57) ABSTRACT

A universal serializer/deserializer ("ser/des") is disclosed that provides hardware implemented modules of those functions determined to be most applicable to a communications protocol. Functionality that is determined to be more unique for a given protocol is implemented in software. Accordingly, a universal ser/des is provided that is able to be used for a plurality of different protocols now known, and configured to communicate with protocols that may be developed in the future.

33 Claims, 7 Drawing Sheets

U.S. PATENT DOCUMENTS

| | | | |
|---|---|---|---|
| 6,085,215 | A | 7/2000 | Ramakrishnan et al. |
| 6,317,774 | B1 | 11/2001 | Jones et al. |
| 6,366,998 | B1 | 4/2002 | Mohamed |
| 6,378,018 | B1 | 4/2002 | Tsern et al. |
| 6,385,713 | B1 | 5/2002 | Yung |
| 6,460,116 | B1 | 10/2002 | Mahalingaiah |
| 6,493,741 | B1 | 12/2002 | Emer et al. |
| 6,542,991 | B1 | 4/2003 | Joy et al. |
| 6,567,839 | B1 | 5/2003 | Borkenhagen et al. |
| 6,718,360 | B1 | 4/2004 | Jones et al. |
| 6,728,722 | B1 | 4/2004 | Shaylor |
| 6,766,515 | B1 | 7/2004 | Bitar et al. |
| 2003/0037228 | A1 | 2/2003 | Kelsey et al. |
| 2003/0110344 | A1* | 6/2003 | Szczepanek et al. ........ 711/100 |

OTHER PUBLICATIONS

Intel Corporation, Pentium Processor Family Developer's Manual, vol. 3: Architecture and Programming Manual, 1995, pp. 25-1 and 25-30.

Eggers, Susan, Simultaneous Multithreading: A Platform For Next-Generation Prcessors, IEEE Micro, Sep./Oct. 1997, pp. 12-19, 0272/1732/97.

El-Kharashi, et al., Multithreaded Processors: The Upcoming Generation for Multimedia Chips, 1998 IEEE Symposium on Advances in Digital Filtering and Signal Processing, Jun. 5-6, 1998, pp. 111-115.

Nemirovsky, Dr. Mario Daniel; Brewer, Dr. Forrest; and Wood, Dr. Roger C.; DISC: Dynamic Instructions Stream Computer; 1991; ACM; pp. 163-171.

* cited by examiner

UNIVERSAL SERIALIZER/DESERIALIZER

RELATED APPLICATION

This application claims priority under 35 U.S.C. § 119(e) to U.S. Provisional Application Ser. No. 60/213,745 filed Jun. 22, 2000, U.S. Provisional Application Ser. No. 60/250,781 filed Dec. 1, 2000, and U.S. Provisional Application Ser. No. 60/251,468 filed Dec. 4, 2000, which are assigned to the same assignee as the present invention and are incorporated, in their entirety, herein by reference.

FIELD OF THE INVENTION

The present invention relates to systems and devices for communicating data and, more specifically, to a serializer/deserializer.

BACKGROUND OF THE INVENTION

The proliferation of connected devices has led to a concurrent proliferation in communications protocols used for transmitting the data. Popular and incompatible protocols include UART, USB 1.1, Ethernet 10 Base-T, SPI/Microwire, and I²C. All of these protocols have advantages and disadvantages that lead to their selection for use by different designers for different applications. Thus, a microcontroller that is designed to be used for communications must be able to receive and transmit data in accordance with at least one of the different protocols. However, to enable the compatibility of a microcontroller with different protocols, traditionally designers used dozens of hardware-implemented blocks designed to address the quirks of each protocol. However, this solution is gate-expensive and prohibits the use of the microcontroller if a protocol is modified, if the microcontroller is used with an existing protocol for which it was not designed, or an entirely new protocol becomes popular. Moreover, if only one or two protocols are used in practice, the inclusion of hardware to address a plurality of protocols is wasteful. Therefore, a universal serializer/deserializer is needed that can be easily adapted to service different now known or later-developed protocols.

SUMMARY OF INVENTION

A universal serializer/deserializer ("ser/des") is disclosed that provides hardware implemented modules of those functions determined to be most applicable to a communications protocol. Functionality that is determined to be unique for a given protocol is implemented in software. Accordingly, a universal ser/des is provided that is able to be used for a plurality of different protocols now known, and configured to communicate with protocols that may be developed in the future.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTION OF THE DRAWINGS

The Figures depict embodiments of objects and features of the present invention(s) and are for illustration purposes only. The Figures are more fully disclosed in the following detailed description, reference being had to the accompanying drawings, in which.

DETAILED DESCRIPTION OF THE PREFERRED EMBODIMENTS

Reference will now be made in detail to several embodiments of the present invention(s), examples of which are illustrated in the accompanying drawings. It is noted that wherever practicable similar or like reference numbers may be used in the figures and may indicate similar or like functionality. One of skill in the art will readily recognize from the following discussion that alternative embodiments of the structures and methods disclosed herein may be employed without departing from the principles of the invention(s) disclosed herein.

Figure 1:
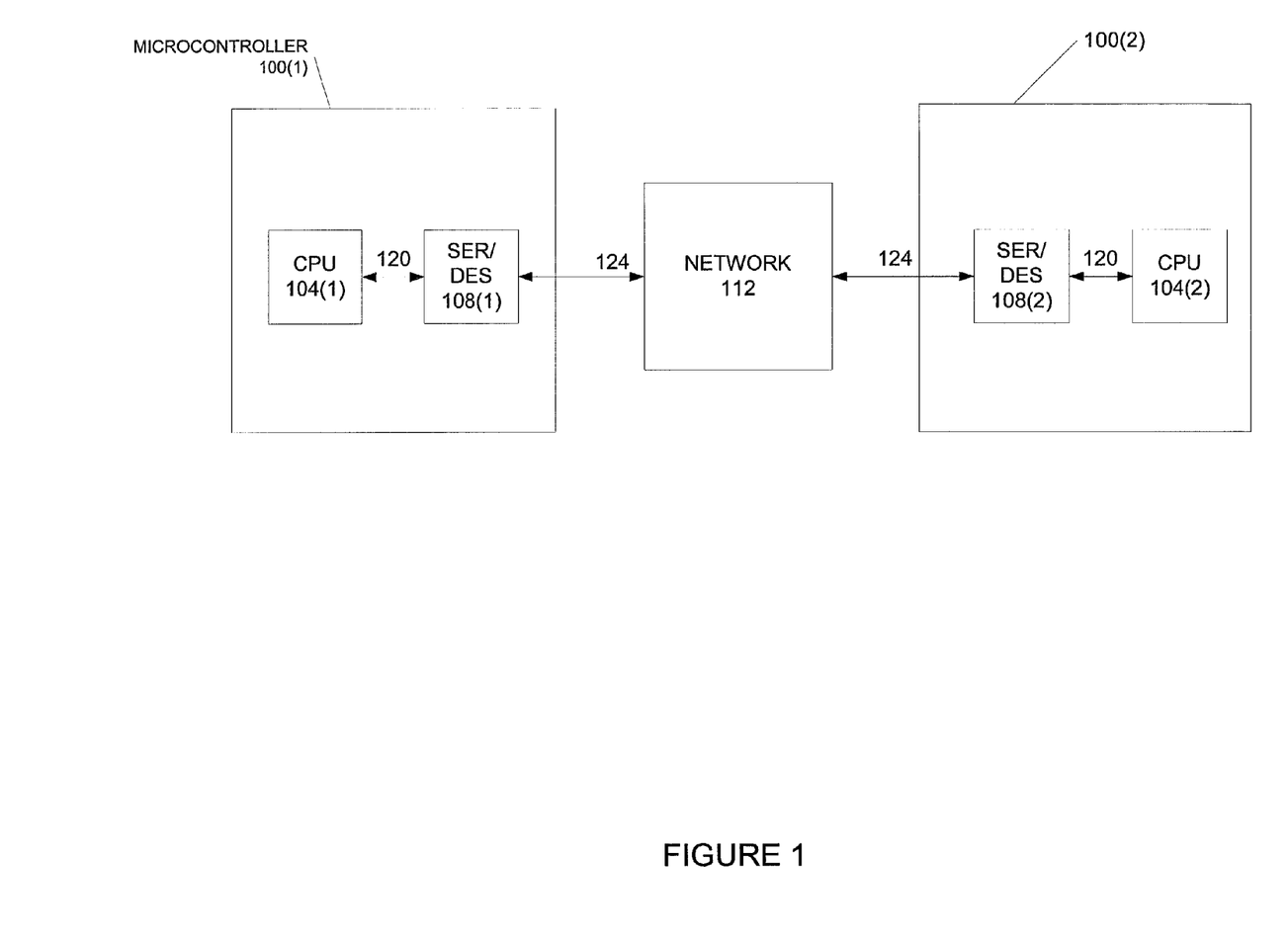
FIG. 1 is a block diagram of a system using universal serializer/deserializers of the present invention.

FIG. 1 is a block diagram of a system using universal serializer/deserializers 108 of the present invention. In this embodiment a universal serializer/deserializer 108(1) is coupled to a central processing unit 104(1) by a data bus 120 in a microcontroller 100(1). Aside from the universal serializer/deserializer 108, the microcontroller 100 may be a conventional microcontroller such as the IP2022 manufactured by Ubicom, Inc. The universal serializer/deserializer 108(1) is coupled to a network 112 through a network connection 124 to enable microcontroller 100(1) to communicate with other devices, such a microcontroller 100(2), or a central server or a personal computer, or the like. If coupled to another microcontroller 100(2), the universal serializer/deserializer 108(2) of the second microcontroller 100(2) receives the data and relays the data to the CPU 104(2) for processing. Although the universal serializer/deserializer 108 is described as being part of a microcontroller, the universal serializer/deserializer of the present invention may be a stand alone unit coupled to a microprocessor, The network connection 124 may be a coaxial cable connection, a telephone line, wireless connection, optical, or any other communications facility. The network 112 may be a local area network or a wide area network, or a direct connection between two computing devices.

To communicate over the network connection 124, data is transmitted in accordance with a protocol. A communications protocol provides encoding, compression, error-checking, and other features to enable efficient and secure transmission of data through a network 112. There are a variety of communications protocols that are commonly used, including UART, I²C, USB 1.1, 10 Base-T (Ethernet), Microwire/SPI, and others. Each protocol has its own advantages and disadvantages and therefore each has been adopted by various device manufacturers as their protocol of choice. In order to communicate with a device that has adopted a particular protocol with which to encode and transmit their data, a receiving device must be able to "deserialize" the data, i.e., decode and interpret the received data in accordance with the strictures of the particular protocol. As these strictures are known, the deserialization function for a particular protocol is easily implemented in hardware, and thus devices that communicate over a network 112 typically include a serializer/deserializer designed to communicate in a particular protocol. Problems arise, however, when a microcontroller 100 must communicate in an environment where different protocols may be used to encode data. Additionally, problems arise when a microcontroller manufacturer does not know a priori in which environment a particular user may be using the microcontroller. To solve this problem, conventional systems require creating a complex serializer/deserializer with separate hardware circuitry for decoding each protocol that the microcontroller may encounter. This approach has several problems. It is wasteful in terms of cost and gates, because the microcontroller may end up communicating in only one protocol. Alternatively, the protocol chosen may become obsolete and the microcontroller itself thereby will becomes obsolete. Thus, in accordance with the present invention, a universal serializer/deserializer is provided that can be adapted, after manufacture, to communicate in a protocol of choice. This is accomplished by identifying universal functions performed by all communications protocols, and implementing those as programmable circuits in hardware, and transferring the unique functionality demanded by a protocol to software.

Figure 2:
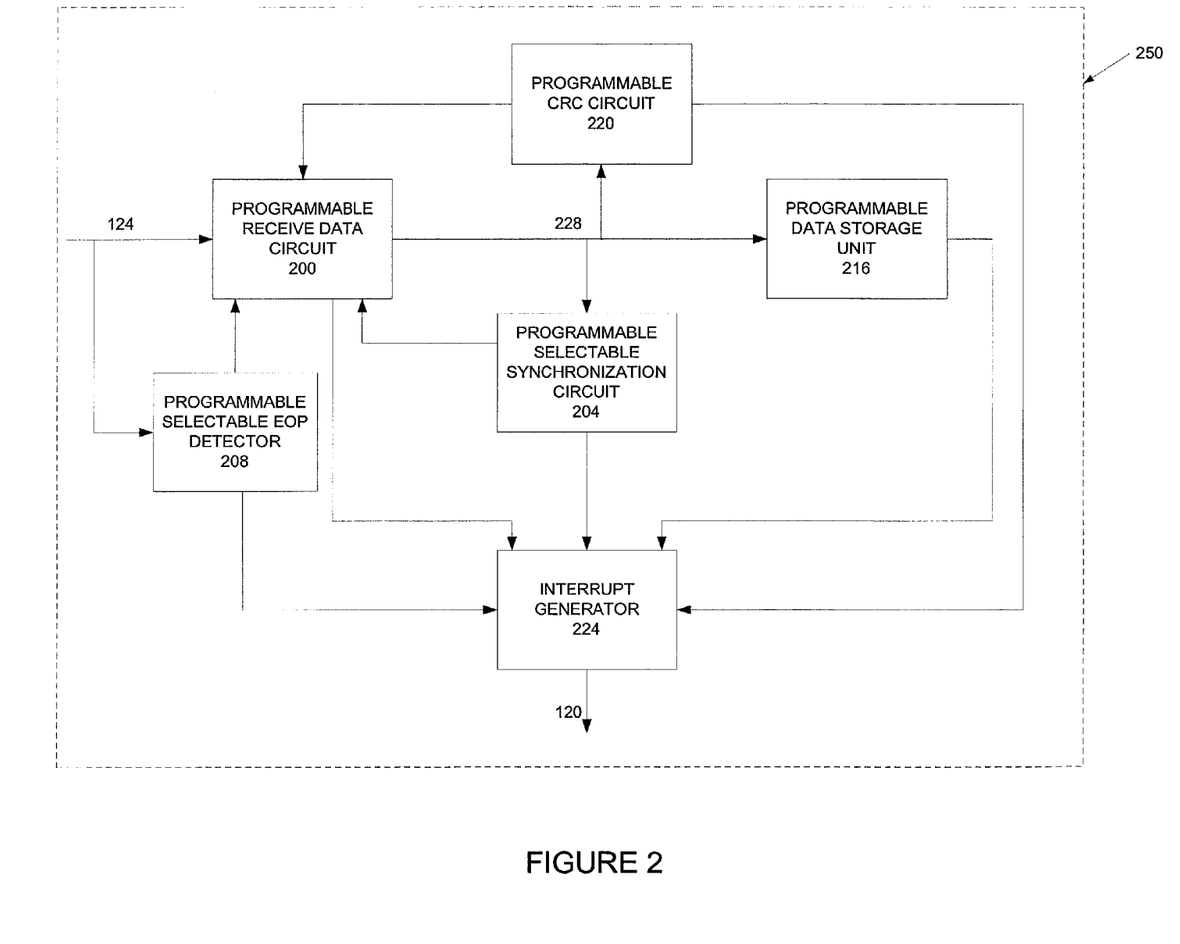
FIG. 2 is a block diagram one embodiment of deserializer circuitry in accordance with the present invention.

FIG. 2 is a block diagram one embodiment of universal deserializer circuitry 250 in accordance with the present invention. The universal deserializer 250 is the component of the universal serializer/deserializer 108 that receives data transmitted over a network connection 124. The universal serializer 600 component is described below with respect to FIG. 6. The data from the network connection 124 is transmitted to a programmable receive data circuit 200. The programmable receive data circuit 200, discussed in more detail below with respect to FIG. 3, receives the data and performs initial data receive functionality, such as decoding (Manchester, NRZI, or the like), separating clock signals from data signals, if required, inverting polarity, and storing the data into a shift register. The receive data circuit 200 is programmable to allow selected functionalities to be performed based on a protocol selection. The functionalities that are enabled in hardware are the most often used functionalities, and these functionalities are programmable to allow them to be tailored for a specific protocol. For example, two frequent encoding methods are Manchester and NRZI, and therefore the universal serializer/deserializer 108 has hardware capable of encoding and decoding in accordance with these methods. For example, Ethernet uses Manchester coding and USB 1.1 uses NRZI coding. and therefore the receive data circuit 200 must be able to be programmed to select the proper decoding method in accordance with a protocol selected.

The received and decoded data 228 is transmitted to a programmable/selectable synchronization circuit 204. The synchronization circuit 204 detects a synchronization pattern in the received data. Many protocols require the transmission of a synchronization pattern, such as the USB and 10 BaseT protocols. The synchronization patterns allow a receiver to synchronize itself to the data transmission. The synchronization circuit 204 is preferably made selectable, because not all protocols use a synchronization pattern. For example, one popular protocol, the UART protocol, does not use a synchronization pattern. The synchronization circuit 204 is also made programmable, because each protocol has its own unique pattern. For example, USB 1.1 uses a synchronization pattern of 00000001 and 10 Base T uses a synchronization pattern of 10101011. When the synchronization circuit 204 determines that a synchronization match has occurred, it transmits a signal back to the receive data circuit 200 to tell the receive data circuit 200 that the incoming signal will be data ready for storing in the data storage unit 216.

The received and decoded data 228 is also transmitted to a programmable/selectable Cyclic Redundancy Check (CRC) circuit 220. The CRC circuit 220 detects for potential errors in the received data, and serves to determine the integrity of the received data. In one embodiment, the CRC circuit 220 is implemented as a software module.

A selectable End of Packet (EOP) detector 208 is also coupled to the network connection 124 to detect an EOP. EOPs are used by many protocols, for example USB 1.1, to signal the end of a transmission. The EOP detector is selectable because not all protocols use this functionality. The EOP detector is also programmable because EOPs can be different for each protocol. For example, the USB 1.1 EOP signal is two single ended zeros and a J-state, and the 10 BaseT EOP signal is a high pulse held in a range of 62.5 to 600 nanoseconds. Thus, as the concept of EOPs is common, an EOP detector 208 is implemented in hardware in accordance with the present invention, and it is made programmable to store the specific EOP pattern required by a protocol. The hardware to implement a programmable/selectable EOP detector 208 is, in one embodiment, a comparator for comparing incoming data with a pattern stored in a register. The EOP detector 208 will transmit a signal to the interrupt generator 224 upon detecting an EOP. The EOP detector is disabled for protocols by the protocol word for those protocols not using EOP detection.

The programmable data storage 216 stores the data 228. The CPU 104 will then use the stored data for whatever purpose the data was sent. In one embodiment, the data storage unit 216 is programmable to allow its storage capability to be modified depending upon the protocol's requirements. This embodiment is described in more detail below with respect to FIG. 5.

Finally, an interrupt generator 224 receives interrupts from all of the circuits described above and generates an interrupt signal in a conventional manner to the CPU 104, to have the CPU 104 take some action based on the nature of the interrupt. For example, the synchronization circuit causes an interrupt when a match is found, the EOP detector 208 will cause an interrupt when an EOP is detected, and the receive data circuit 200 will generate an interrupt when data begins to be received.

The above description is only one embodiment of a universal deserializer 250 in accordance with the present invention. Some or all of the circuits can be used in accordance with the present invention, and additional circuits can be added within the scope of the present invention. For example, a non-programmable double buffer may be used in place of a programmable data storage unit 216. Alternatively, a universal serializer/deserializer 108 may be used without EOP detection, and so forth. However, the deserializer 250 described above enables one microcontroller 100 to be used with a plurality of protocols, without requiring a large gate count and without restricting the microcontroller 100 to be used with protocols known a priori.

Figure 3:
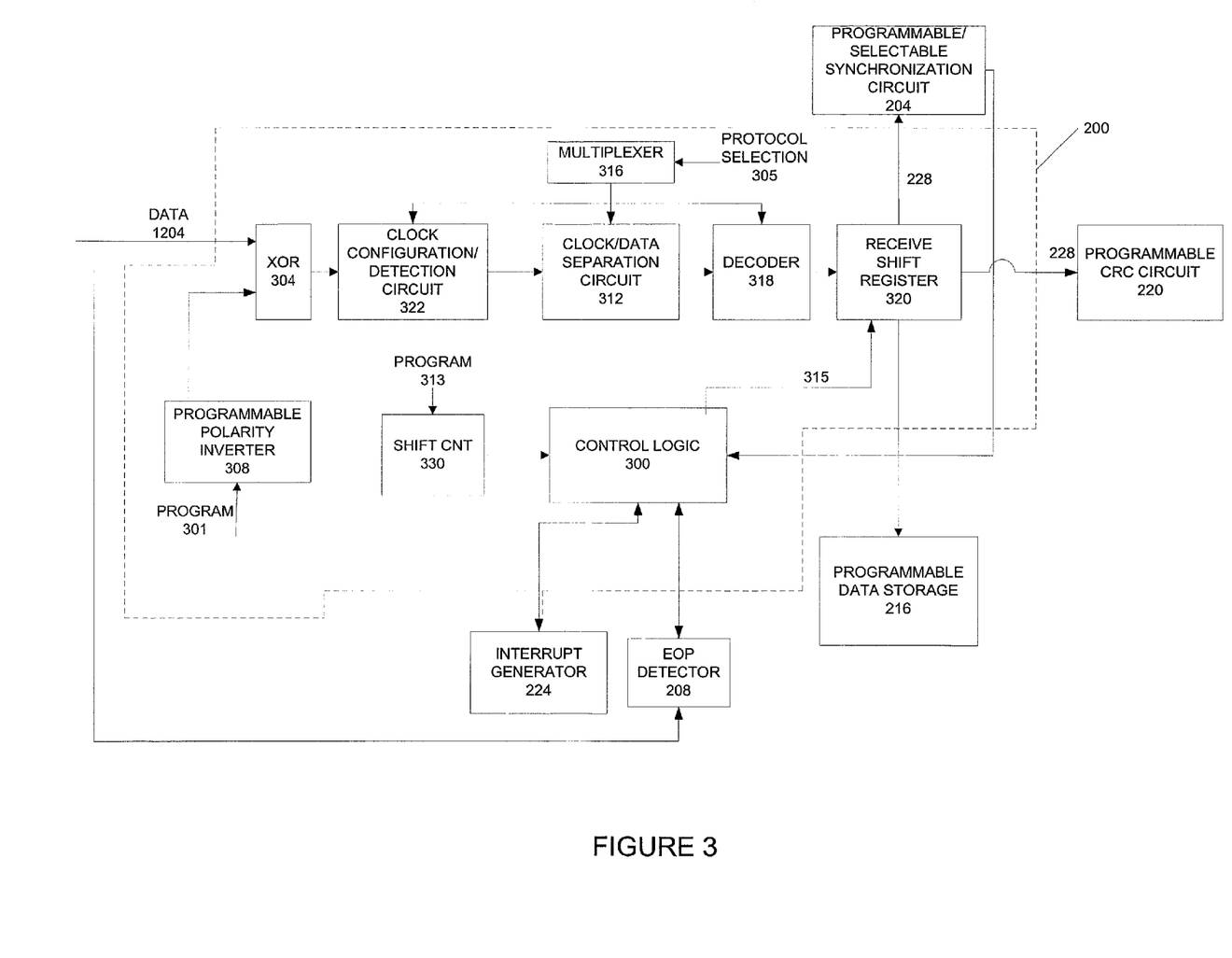
FIG. 3 is a more detailed block diagram of the programmable receive data circuit in accordance with the present invention.

FIG. 3 is a block diagram of one embodiment of the data receive circuit 200. The data from the network connection 124 is transmitted to an exclusive OR gate 304 to invert the signal and is combined with an input from a programmable polarity inverter 308 to select whether or not inversion is desired. The polarity inverter 308 receives a program signal 301 that either enables or disables the polarity inversion performed by the exclusive OR gate 304. Some protocols require polarity inversion, such as UART, which can use either −12 volts or +12 volts as a signal. Thus, the programmer of the microcontroller 100 selects polarity inversion if polarity inversion is appropriate. In one embodiment, polarity inversion selection is a bit in a protocol selection word, that selects the polarity when a polarity is selected. If the polarity inversion is selected, the signal 124 is inverted by the exclusive OR gate 304 prior to being transmitted to the rest of the circuit 200.

Then in one embodiment, data is transferred to a programmable clock configuration/detection circuit 322. The clock detection circuit 322 detects start conditions for various protocols. For example, I$^2$C uses a start condition of a falling edge, with a high clock. UART uses the first falling edge to detect the start bit. Falling edge detectors as are known in the art are used to detect the falling edge for UART, and the falling edge and a clock sampler are used for I$^2$C. SPI uses a rising edge of the clock to detect a start condition, and clock detection circuit 322 samples the clock to determine when the start condition is present when the SPI protocol is selected. The start condition to detect is selected by the programmer when a protocol is chosen. The clock configuration component of the circuitry 322 also configures a clock for a selected protocol. For example, for I$^2$C, an internal clock with a rising edge is selected for masters and an external clock for slaves. For Microwire, the clock is set to two times actual speed for a certain frequency clock, and with opposing phases for transmit and receive. The clock configuration circuitry 322 preferably has a phase lock loop for generating a specific frequency and phase, and is preferably programmed by the protocol word 305.

Next, the data is transmitted to a selectable/programmable clock/data separation circuit 312. This circuit provides clock data separation if required. For example, the 10BaseT protocol requires clock data separation. Thus, if the 10BaseT protocol is selected, the signal is transmitted to the clock data separation signal to have the clock and data portions of the signal separated out using conventional techniques. A protocol selection word 305 is input to the multiplexer 316, and, if the protocol selected does not require separation, the clock/data separation circuit 312 is bypassed. This circuit 312 also provides clock division if required. For example, for a core clock of 200 MHZ, the clock is divided by 2000 for a typical I$^2$C implementation. In this embodiment, the circuit 312 has an input to select a number by which to divide a clock. Alternatively, some protocols may require two different clock sources. For example UART uses a divide by 16 clock to perform bit sampling. Therefore, the clock separation circuit 312 will divide received clock by 16 to provide a bit sampling clock.

Next, the signal is transmitted to a decoder 318. The decoder 318 performs any decoding necessary for a protocol. The multiplexer 316 is coupled to the decoder 318 to select the appropriate type of decoding to perform. For example, a protocol such as USB 1.1 uses NRZI encoding, and therefore if the protocol word 305 selects NRZI, the decoder 312 performs NRZI decoding. If a protocol selected uses a different type of decoding, such as Manchester, the protocol word 305 will select the appropriate decoding type. If no decoding is required, the decoder 312 is bypassed. The most popular coding techniques are preferably implemented in hardware and are therefore available to be used by the serializer/deserializer 108. This retains high speed for decoding processes and still allows the serializer/deserializer 108 to be highly flexible. In a further embodiment, the decoder 318 also performs bit unstuffing if appropriate for a protocol. For example, after NRZI decoding is performed for USB, every 0 after six consecutive 1's must be dropped. The actual circuitry used for performing clock division, Manchester and NRZI decoding, and bit unstuffing is conventional, and is apparent to one of ordinary skill of the art. However, the selectable and programmable use of the different hardware implemented circuits enables the universal serializer/deserializer 108 to provide a fast and flexible solution for multiple protocols.

In one implementation, the universal serializer/deserializer 108 is coupled to a single input to receive network data over the network data line 124 that is transmitted in a combined clock/data format. Data received on this input is transmitted directly to the clock/data separation circuit 312 for clock separation.

The decoded data is transmitted to a receive shift register 320. The receive shift register 320 receives bits one bit at a time. The synchronization circuit 228 is also coupled to the receive shift register 320 to analyze the decoded data to determine if a synchronization pattern is present. When instructed by the control logic 300 that there is a synchronization match, the receive shift register 320 loads the received data into the data storage unit 216. In one embodiment, once a match is found, the synchronization circuit 228 is disabled until the end of the transmission, to avoid any false recognitions of the synchronization pattern in the actual data.

The control logic 300 is coupled to the receive shift register 320 across a load/shift data line 315. If a protocol uses a synchronization pattern, when a synchronization match signal is transmitted to the control logic 300, the control logic 300 then starts decrementing the value in a shift counter 330 as it shifts in data into the receive shift register 320. The value in the shift counter 330 is programmed by the user for a particular protocol. For example, for a SPI protocol, the value may be 8, which indicates that the protocol stores data in groupings of 8 bits, and therefore each time 8 bits are loaded into the shift register 320, the data is loaded into the data storage unit 216. When the value in the shift counter 330 is zero, the control logic 300 knows that a full set of data has been received. At this point, the control logic 300 will send a signal to the shift register 320 to load the data into the data storage unit 216 and send a signal to the interrupt generator 224 to generate an interrupt to indicate that data is now in the data storage unit 216, available to be read. Some protocols do not have a fixed length for data. For example, in USB, the data length is variable, and a receiver must detect an EOP symbol to know when the data has been fully received. Thus, for these protocols, once a synchronization pattern has been detected, or the initial start of the data has been otherwise detected, the shift counter 330 (either the same counter or a similar counter) is incremented each time a bit is shifted into the shift register 320. The counter is incremented until an EOP is detected. Then, this value is used as an actual bit count of the data received, which is useful for those protocols that do not have a fixed data length. Thus, the receive data circuit 200 can be used with fixed and variable data length protocols, protocols that use polarity inversion, combined clock or separate data signals, and different types of decoding. This provides a very flexible serializer/deserializer 108 that does not require a high gate count.

Figure 4:
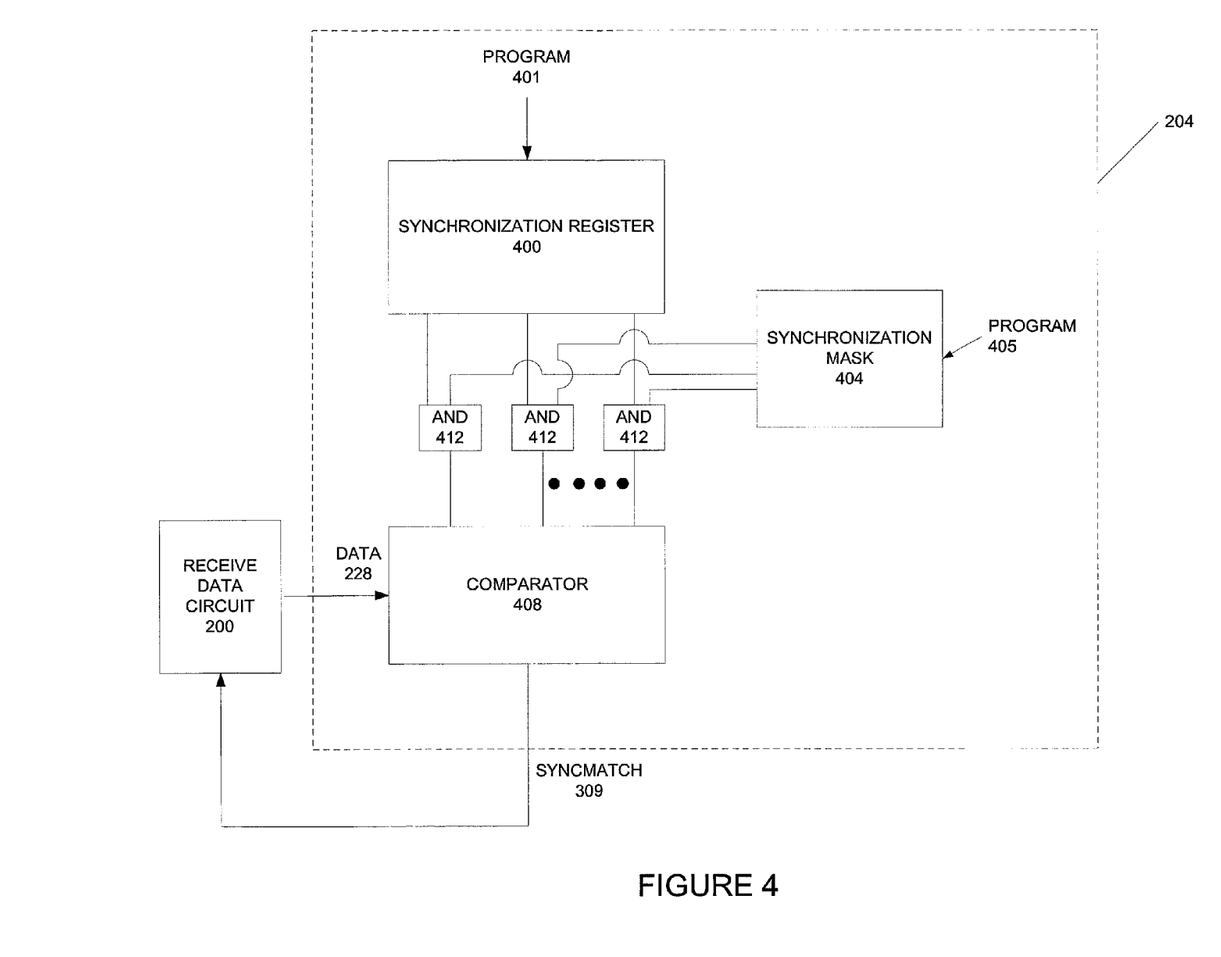
FIG. 4 is a more detailed block diagram of the programmable/selectable synchronization circuit in accordance with the present invention.

FIG. 4 illustrates a synchronization circuit 228 in accordance with the present invention. In this embodiment, a synchronization register 400 is coupled to a program line 401 to receive a synchronization pattern. A programmer will transfer a synchronization pattern into a synchronization register 400 associated with whichever protocol the programmer will be using. One common problem addressed by serializer/deserializers is the problem of synchronization patterns that are corrupted as they are transferred through various hubs. For example, an eight-bit pattern may have a bit corrupted at each of three hubs. Thus, a synchronization mask 404 is used to mask out those potentially corrupted bits from the mask, so the comparison between the masked pattern and the corrupted synchronization pattern will still be accurate. The settings for the mask 404 of the present invention are programmable, and is therefore determined by a programmer at run time. This enables the serializer/deserializer 108 to be optimized for its environment at a time in which its environment is accurately known. The mask value enables various AND gates 412 which will set low or high (depending on convention) a bit in the synchronization pattern. Then, the masked (if applicable) pattern is compared by a comparator 408 to the decoded data 228. The comparator 408 is preferably a digital comparator. Upon detecting a match, a synchronization mask signal 309 is transmitted back to the receive data circuit 200. Thus, the programmable synchronization circuit 228 enables the addition of synchronization matching to a serializer/deserializer 108 if needed.

Figure 5:
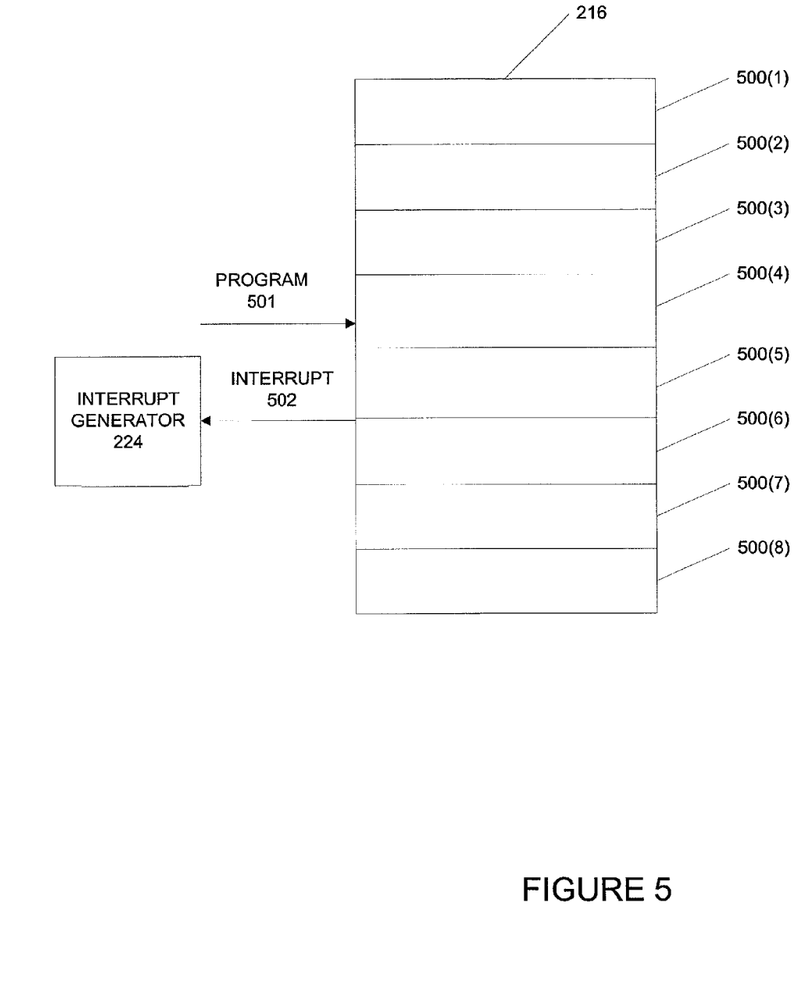
FIG. 5 is a block diagram of a programmable data storage unit in accordance with the present invention.

FIG. 5 illustrates an embodiment of a programmable data storage unit 216 in accordance with the present invention. The programmable data storage unit 216 stores a number of words in a FIFO manner, depending on the protocol selected. Data is read out of the receive shift register 320 into the data storage 216 until a word limit has been reached. The word limit is set by a programmer for a particular protocol. When the word limit is reached, the storage unit 216 is full and an interrupt signal is transmitted to the interrupt generator 224 to cause the CPU 104 to take some action. For some protocols, only 1 word may be necessary to store data, and therefore only 1 buffer 500 is selected. In this example, after every word is received, the CPU 104 retrieves the data and performs some action. For others, larger groups of data are more useful. Accordingly, multiple buffers 500 are selected and the CPU 104 is not notified until all of the selected buffers 500 are full. This minimizes the time the CPU 104 must spend in processing data for the appropriate protocol. A programmer will transmit a program signal 601 to the buffer 201 to select the number of buffers 500 to be used as the data buffer 216. Although words are described above as the grouping of data in each buffer 500, any other grouping may be used in accordance with the present invention.

Figure 6:
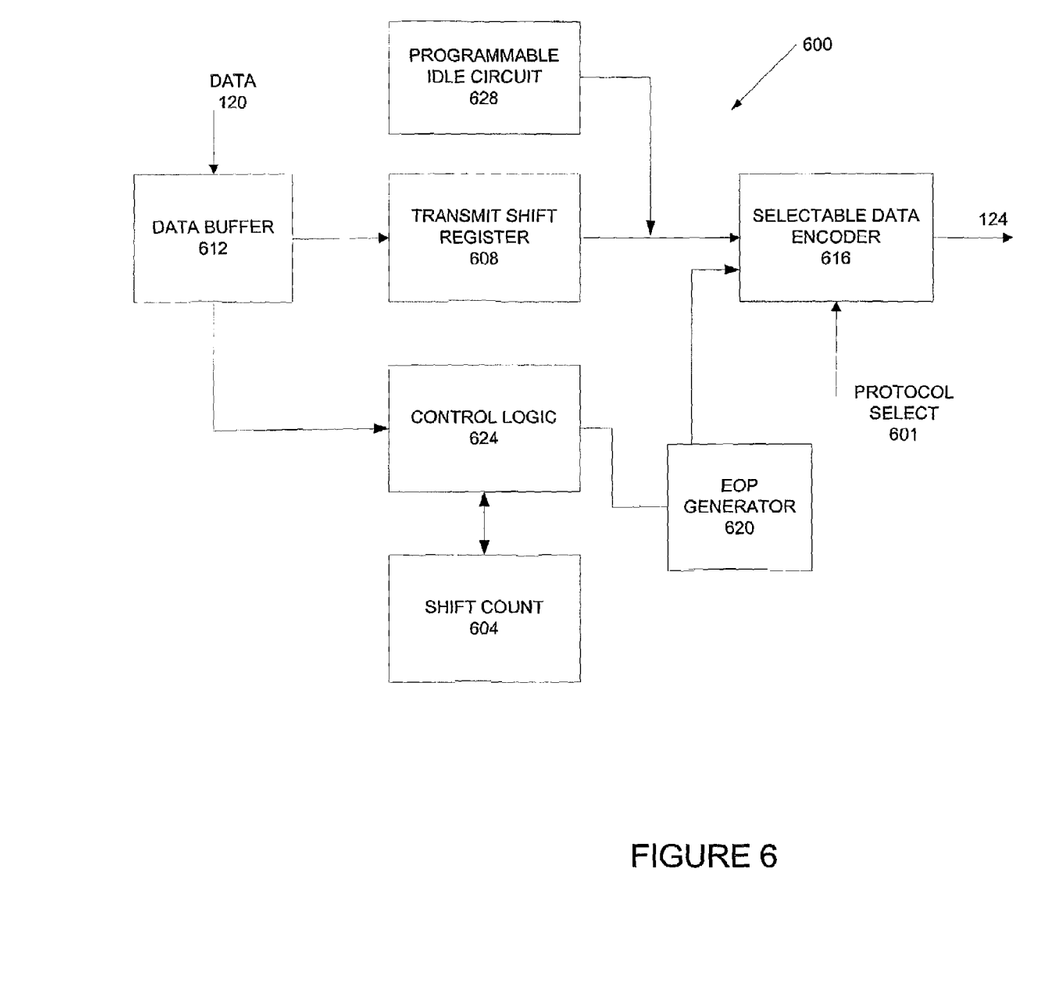
FIG. 6 is a block diagram of a serializer in accordance with the present invention.

FIG. 6 is a block diagram illustrating the serializer side of the serializer/deserializer 108. The serializer 600 provides the opposite functionality of the deserializer 250 described above. Data to be written is transmitted over the data bus 120 to a transmit data buffer 612. The transmit data buffer 612 is typically a FIFO or similar structure. The programmer selects a shift count value to store in the shift count register 604 in accordance with a selected protocol. Thus, if the protocol sends data in groupings of 8 bits, the shift count is set to 7. Then, once the data buffer 612 is full, the control logic 624 causes the data buffer 216 to load the data into a transmit shift register 608. Once the data is loaded, the data is shifted out, and the control logic 624 decrements the shift count in the shift count register 604 until the counter 604 has reached zero. The data is encoded by a selectable data encoder 616 into the appropriate encoding scheme, based on the protocol selection input 601. After the last bit to be transmitted is shifted out of the shift register 608, the control logic 624 causes the EOP generator 620 to generate an EOP if appropriate for the selected protocol. The EOP is also encoded by the data encoder 616. Then, the data is transmitted onto the network data line 124, for transmission across the network. In one embodiment, the serializer also comprises an idle generator 628. The idle generator 628 generates an idle signal when there is no longer any data to transmit. Some protocols require a specific idle signal to be transmitted when nothing is being received or transmitted. Accordingly, the specific signal pattern required is programmed into a register, and that signal is transmitted when no data is being received or transmitted. Typically, there are three possible idle states, zero, one, or tri-state, and the specific state can be selected by a program input. For example, Ethernet requires both zeroes on the differential outputs as an idle state.

Figure 7:
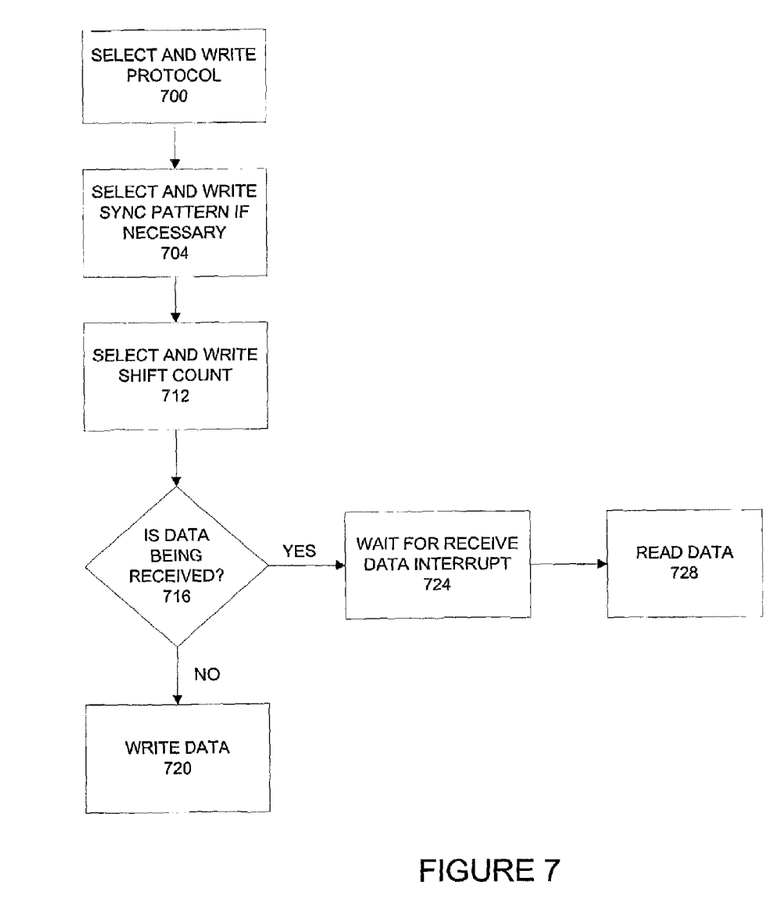
FIG. 7 is a flow chart illustrating a method of using the serializer/deserializer of the present invention.

FIG. 7 illustrates a method of using the universal serializer/deserializer 108 of the present invention. First, the programmer selects 700 and writes a protocol to the universal serializer/deserializer 108. In a preferred embodiment, the protocol word also selects the type of encoding, polarity, clock selection, and other protocol specific information. Then, the programmer selects 704 a synchronization pattern and writes the pattern to the universal serializer/deserializer 108, if appropriate for the selected protocol. Then, the programmer selects 712 and writes a shift count to a shift count register. Then, if data is being received, the universal serializer/deserializer waits 724 for a receive data interrupt and receives 728 data based on the parameters selected above. If data is being written, the programmer writes 720 the data to be transmitted, and the universal serializer/deserializer 108 will send the data and generate an EOP if appropriate for the selected protocol. In further embodiments, a programmer will select the word limit for a programmable data buffer. In a further embodiment, the programmer will select an idle pattern to be broadcast when no data is being transmitted or received.

The following describes procedures for configuring one embodiment of the universal serializer/deserializer 108 for specific, commonly known protocols. For UART, the UART protocol is selected, and this will cause data to be clocked in after a valid start bit is detected in the clock configuration/detection circuit 322. The polarity bit of the polarity inverter 308 is preferably set as the polarity in UART can vary. The clock division in the clock/data separation circuit 312 is set to be 16 times the desired baud rate. The shift count register 330 is programmed with a value appropriate for the specific UART format being used, depending on the number of data bits, stop bits, and parity bits. The synchronization circuit 204 and an EOP Detector 208 are disabled.

For SPI/Microwire, the clock is set to two times actual speed by the clock configuration circuit 322, and with opposing phases for transmit and receive. If in slave mode, an external clock is used, and if a master, an internal clock is sued. The programmer determines whether the designated chip select or slave select line is activated. For master, the programmer sets the designated chip select to the active level, before enabling the serializer/deserializer 108.

For USB 1.1, the differential inputs are used for EOP detection. The clock selection circuit 322 is programmed with values for the recovered clock, and the phase lock loop is programmed with the appropriate frequency. The synchronization pattern is programmed into the synchronization register 204 and used to detect synchronization patterns and encode synchronization patterns in the transmitted data.

For 10 Base-T Ethernet, the clock configuration circuit 322 is programmed to be "recovered clock" and the phase lock loop is programmed to the appropriate speed for oversampling. Polarity detection and reversal is enabled. Carrier sense, jabber detection, link pulse generation, random back off for collision detection, and MAC layer functions are preferably performed in software.

The above are some specific implementations for using current protocols with the universal serializer/deserializer 108 of the present invention. Thus, a single serializer/deserializer 108 can be used to enable all of the above protocols, without requiring a high gate count resulting from creating serializer/deserializer circuits designed to respond to each protocol individually. However, the modular approach used to create the universal serializer/deserializer 108 enables its use for new protocols. The hardware functionality provided in the universal serializer/deserializer 108 is for basic, universal functions, and its programmable nature allows these basic functions to be tailored for a new protocol that is later developed. For example, a new protocol that uses Manchester decoding, a combined clock, and no synchronization could be implemented using the universal serializer/deserializer 108 simply by programming the appropriate registers. The most complicated functions are performed in hardware, thus maintaining the speed of the serializer/deserializer operations, but the software component allows the hardware to be tailored for the specifics of any new protocol.

In a further embodiment, the universal ser/des of the present invention may also provide protocol translation, by coupling two universal serializer/deserializers together, each programmed for the appropriate protocol. Thus, a first ser/des is programmed to receive in a first protocol, for example, USB, and, after the data is decoded, the second ser/des is used to transmit the data in a second protocol, for example, 10BaseT. Thus, using two serializer/deserializers enables a product that can easily provide protocol translation.

It can thus be appreciated that a new and novel method and apparatus for serialization and deserialization has been disclosed. Upon reading this disclosure, those of skill in the art will appreciate still additional alternative methods and designs for a universal serializer/deserializer in accordance with the present invention. Thus, while particular embodiments and applications of the present invention have been illustrated and described, it is to be understood that the invention is not limited to the precise construction and components disclosed herein and that various modifications, changes and variations which will be apparent to those skilled in the art may be made in the arrangement, operation and details of the method and apparatus of the present invention disclosed herein without departing from the spirit and scope of the invention as defined in the appended claims.

What is claimed is:

1. A deserializer for receiving data transmitted over a network, the deserializer in a universal serializer/deserializer programmable for implementing two or more communications protocols, the deserializer comprising:

a programmable receive data circuit for receiving the data, for performing initial data receive functions, and for coupling to a network connection;

a synchronization circuit for selectably detecting a synchronization pattern in the data, the synchronization circuit configured to be programmed with the synchronization pattern corresponding to a current protocol of the two or more communications protocols, and coupled to the programmable receive data circuit for signaling a match signal in response to matching the synchronization pattern with the data;

a selectable CRC circuit for detecting errors in the data and determining integrity of the data, the selectable CRC circuit coupled to the programmable receive data circuit for signaling in response to detecting an error or in the data;

a data storage device for storing the data to be accessed by a CPU, the data storage device coupled to the programmable receive data circuit for receiving the data; and an interrupt generator for generating interrupt signals in response to interrupt generating signals, the interrupt generator coupled to the programmable receive data circuit, the selectable CRC circuit, the synchronization circuit, and the data storage device for receiving the interrupt generating signals, and coupled to the CPU for providing the interrupt signals.

2. The deserializer of claim 1, wherein the protocol specific receive functions comprise at least one of decoding the data according to a decoding scheme, separating clock signals from data signals in the data, inverting polar of the data signals, and storing the data into a shift register.

3. The deserializer of claim 2, wherein the decoding scheme is one of Manchester decoding scheme or Non-Return-to-Zero Inverted ("NRZI") decoding scheme.

4. The deserializer of claim 1, wherein the programmable receive data circuit further comprises hardware that enables a receive function required for at least two of the two or more communications protocols.

5. The deserializer of claim 1, wherein the synchronization circuit is not selected in response the current protocol being a UART protocol.

6. The deserializer of claim 1, wherein the synchronization pattern programmed in the synchronization circuit is a logic 00000001 and the current protocol is USB 1.1.

7. The deserializer of claim 1, wherein the selectable CRC circuit is a module implementing a CRC function from software instructions.

8. The deserializer of claim 1, further comprising an END-OF-PACKET detector for selectably detecting an End-Of-Packet pattern, the End-Of-Packet detector configured to be programmed with the End-Of-Packet pattern corresponding to the current protocol of the two or more communications protocols, configured to not operate in response to not being selected, and configurable to couple to the network connection for receiving the data and to the interrupt generator for signaling an End-Of-Packet detection.

9. The deserializer of claim 8, wherein the End-Of-Packet pattern programmed in the End-Of-Packet detector is one of a two single ended zeros and a J-state according to a USB 1.1 protocol and a high pulse held in a age of 62.5 to 600 nanoseconds according to a 10-base T protocol.

10. The deserializer of claim 8, wherein the End-Of-Packet detector further comprises:

a register for storing the End-Of-Packet pattern programmed in the End-Of-Packet detector; and a comparator coupled to the programmable receive data circuit and the register for comparing the data with the End-Of-Packet pattern.

11. The deserializer of claim 1, wherein the data storage device is one of a programmable data storage unit and a non-programmable double buffer.

12. The deserializer of claim 11, wherein the data storage device is the programmable data storage unit configured to be programmed to modify its data storage capability to meet the requirements of the protocol.

13. The deserializer of claim 1, wherein the data storage device further comprises a set of selectable buffers, the data storage device configured to receive a program signal indicating a bit limit for the current protocol of the two or more communications protocols and coupled to the interrupt generator for providing a signal in response to reaching the bit limit.

14. The deserializer of claim 13, wherein the data storage device is further configured to select a number of buffers of the set of selectable buffers, the number of buffers corresponding to a number of data bits required to store a bit limit number of bits.

15. A data receive circuit for a deserializer in a universal programmable serializer/deserializer having a synchronization circuit, a data storage device and a CRC circuit for implementing a programmed protocol from a set of communications protocols, the data receive circuit comprising:

an exclusive-OR gate (XOR) configurable to be coupled to a network connection for receiving an input signal carrying a data and for selectably performing a polarity inversion of the input signal;

a polarity inverter coupled to the XOR for inverting the input signal and configured to receive a first program signal indicating whether the programmed protocol requires the polarity inversion;

a clock detection and configuration circuit coupled to the XOR for detecting a protocol specific start condition of the programmed protocol selected from a set of programmed start condition patterns and for providing a protocol specific clock signal of the programmed protocol selected from a set of programmed clock signal definitions in response to receiving a protocol selection indicating the programmed protocol;

a clock/data separation circuit coupled to the clock detection and configuration circuit for selectably providing separation of clock information from data information in the input signal in response to receiving the protocol selection indicating the programmed protocol;

a decoder coupled to the clock/data separation circuit for selectably performing a protocol specific decoding function of the programmed protocol selected from a set of programmed decoding functions in response to receiving the protocol selection indicating the programmed protocol;

a multiplexer coupled to the clock detection and configuration circuit, to the clock/data separation circuit, and to the decoder for supplying the protocol selection and configured to receive a second program signal indicating the requirements of the programmed protocol;

a receive shift register coupled to the decoder, to the synchronization circuit, to the CRC circuit and to the data storage device, the receive shift register for receiving the data one bit at a time from the decoder and providing the data, several bits at a time, to the synchronization circuit, the CRC circuit, and the data storage device;

a control logic circuit coupled to the receive shift register, and the synchronization circuit, the control logic for receiving a synchronization match signal from the synchronization circuit and for instructing the receive shift register to provide the data to one of the synchronization device and the data storage device and for setting a number of bits in the several bits used in accordance to the programmed protocol in response to a third program signal indicating the number of bits required by the programmed protocol.

16. The data receive circuit of claim 15, wherein the first program signal is a bit of a protocol selection word.

17. The data receive circuit of claim 15, wherein the set of programmed start condition patterns programmed in the clock detection and configuration circuit comprises an Inter-Intergrated-Circuits ("I²C") falling edge with a high clock, a UART falling edge, a SPI rising clock edge.

18. The data receive circuit of claim 15, wherein the clock detection and configuration circuit further comprises:

a clock sampler having an edge detector coupled to the XOR for sampling the clock to detect the rising and falling edges of the input signal in detecting the protocol specific start condition of the programmed protocol; and a phase lock loop for generating a clock signal with a programmable frequency and a programmable phase in providing the protocol specific clock signal of the programmed protocol.

19. The data receive circuit of claim 15, wherein the multiplexer bypasses one or more of the clock detection and configuration circuit, the clock/data separation circuit, and the decoder in response to the second program signal indicating the programmed protocol requirements.

20. The data receive circuit of claim 15, wherein the clock/data separation circuit further selectably provides clock division of the clock signal as required by the programmed protocol.

21. The data receive circuit of claim 15, wherein the set of programmed decoding functions of the decoder comprises a function from the group consisting of a Non-Return-to-Zero Inverted ("NRZI") decoding function and a Manchester decoding function.

22. The data receive circuit of claim 21, wherein the function from the group consisting of a Non-Return-to-Zero Inverted ("NRZI") decoding function and a Manchester decoding function of the decoder are programmed in a hardware implementation for being performed faster an decoding functions programmed in a software implementation.

23. The data receive circuit of claim 15, wherein the decoder further selectably performs bit unstuffing in response to being required by the programmed protocol.

24. The data receive circuit of claim 15, wherein the control logic circuit is further coupled to a shift count register indicating a number of bits loaded into the receive shift register.

25. The data receive circuit of claim 24, wherein the number of bits loaded into the receive shift register is used in response to the programmed protocol not having a fix number of bits.

26. A synchronization circuit for a deserializer in a universal programmable serializer/deserializer having a data receive circuit, the serializer/deserializer for implementing a programmed protocol from a set of communications protocols, the synchronization circuit comprising:

a synchronization register configured to receive a first program signal indicating a synchronization pattern corresponding to the programmed protocol;

a programmable synchronization mask coupled to the synchronization register through as set of logic gates for masking out a corrupted bit for optimizing the synchronization circuit to operate in a particular environment, the programmable synchronization mask configured to receive a program signal indicating settings for the masking; and a comparator coupled to the programmable receive data circuit for receiving an input data signal and coupled to the logic gates for receiving the synchronization pattern, the comparator for comparing the synchronization pattern with the input data signal and for producing a match signal in response to matching the synchronization pattern with the input data signal.

27. The data receive circuit of claim 26, wherein the logic gates are AND gates which modify the corrupted bit by changing a logic value of the corrupted bit to a programmed logic value indicated by the settings.

28. The data receive circuit of claim 26, wherein the comparator is a digital comparator.

29. A serializer for transmitting data over a network, the serializer in a universal serializer/deserializer programmable for implementing two or more communications protocols, the serializer comprising:

a data buffer for receiving the data to be transmitted from a processor and configured to receive a load signal for loading off the data;

a transmit shift register coupled to the data buffer for loading the data off the data buffer, the shift register further for serially shifting the data out;

a control logic circuit coupled to the data buffer for providing the load signal and configured to receive a bit number corresponding the a current protocol of the two or more communications protocols, wherein the load signal is provided upon reaching a bit-number number of bits received by the data buffer; and a programmable encoder coupled to the transmit shift register for receiving the shifted out data, for selectably performing an encoding function required for the current protocol in response to receiving a protocol selection signal indicating the current protocol, and for transmitting the data out of the serializer.

30. The serializer of claim 29, wherein the control logic circuit further comprises a shift counter configured to receive a program signal indicating the bit number and configured to count a number of bits received by the data buffer and to indicate the number of bit reaching the bit-number.

31. The serializer of claim 29, further comprising an End-Of-Packet generator coupled to the control logic circuit and to the programmable encoder for selectably generating a End-Of-Packet pattern corresponding to the current protocol in response to receiving a last bit signal from the control logic circuit and for providing the End-Of-Packet pattern to the programmable encoder for transmission.

32. The serializer of claim 29, further comprising a programmable idle circuit for selectably providing an idle signal corresponding to the current protocol in response to the transmit shift register no data to transmit.

33. The serializer of claim 32, wherein the idle signal is one of an all logic zero state, an all logic one state, and a tri-state.

* * * * *

UNITED STATES PATENT AND TRADEMARK OFFICE
CERTIFICATE OF CORRECTION

PATENT NO. : 7,010,612 B1
APPLICATION NO. : 09/888212
DATED : March 7, 2006
INVENTOR(S) : Kwok Hung Si et al.

It is certified that error appears in the above-identified patent and that said Letters Patent is hereby corrected as shown below:

Title page,
Item [56], References Cited, U.S. PATENT DOCUMENTS,
delete "5,247,638".

Column 10,
Line 15, after "error" delete "or".
Line 30, delete "polar" and insert -- polarity --.
Line 60, delete "age" and insert -- range --.

Column 12,
Line 47, delete "an" and insert -- than --.

Column 14,
Line 27, after "register" insert -- having --.

Signed and Sealed this

Twentieth Day of June, 2006

JON W. DUDAS
*Director of the United States Patent and Trademark Office*